United States Patent [19]

Hallford et al.

[11] Patent Number: 4,713,620

[45] Date of Patent: Dec. 15, 1987

[54] DUAL SIGNAL AMPLITUDE MODIFYING AND COMBINING APPARATUS

[75] Inventors: Ben R. Hallford, Wylie; Karl R. Varian, Plano, both of Tex.

[73] Assignee: Rockwell International Corporation, El Segundo, Calif.

[21] Appl. No.: 945,283

[22] Filed: Dec. 22, 1986

[51] Int. Cl.⁴ .............................................. H03K 17/00
[52] U.S. Cl. ..................................... 328/150; 307/350
[58] Field of Search ............... 307/490, 491, 492, 493, 307/494, 498, 529, 350, 362; 328/144, 145, 150, 158; 330/129, 147, 279, 69

[56] References Cited

U.S. PATENT DOCUMENTS 3,636,338  1/1972  Abnett et al. ..................... 328/145 X
3,760,185  9/1973  Green ............................... 307/492 X Primary Examiner—Eugene R. LaRoche
Assistant Examiner—Steven J. Mottola
Attorney, Agent, or Firm—Bruce C. Lutz; V. L. Sewell; H. Fredrick Hamann

[57] ABSTRACT

The present inventive concept combines two signals, each representative of a portion of a single signal, wherein the two signals have different non-linear slopes, and produces a single linearly changing output signal indicative of the combination. This circuit is specifically used in combination with the feedback loop of a delayed automatic gain control circuit to detect the signal level applied to the gain control circuit and to provide a linearly changing output signal representative of the decibel value of the signal applied to the automatic gain control circuit. This is accomplished by linearizing the two different signals independently, and establishing a maximum value for one signal, a minimum value for the other signal, and summing these in conjunction with a reference to produce a single composite linearly changing signal.

6 Claims, 5 Drawing Figures

DUAL SIGNAL AMPLITUDE MODIFYING AND COMBINING APPARATUS

THE INVENTION

The present invention pertains generally to electronics, and more specifically to signal modifying and detection circuits. Even more specifically, the present invention relates to a means for detecting and modifying signals found in the feedback loop of a delayed automatic gain control circuit to obtain a linearly changing output representative of the decibel value of signal level applied to the automatic gain control circuit over a wide range of input signals.

BACKGROUND

In various electronic circuits such as diversity signal reception of microwave downconverters, it is desirable to know the signal levels into each diversity receiver, and to be able to use a signal level monitoring voltage to control a data switch to choose the stronger level signal. While such signal monitoring devices are available in the prior art, they are not only very expensive, but a typical measuring range of such a commercial device is only in the neighborhood of 50 dB. The expense of such a device is typically in the neighborhood of thousands of dollars. The present invention, on the other hand, is able to measure a signal range greater than 60 dB in one embodiment of the invention with an estimated manufacturing cost of much less than $100. Thus, the present invention numerically has several orders of magnitude greater signal measuring range while also having more than an order of magnitude lower cost.

The present invention does not directly detect (and thus does not interfere with) the actual signal applied to the receiver, but rather detects the amplitude of the IF output and feedback signals around the delayed automatic gain control circuit (AGC), and combines these two signals in such a manner that a composite linearly changing dc signal is obtained directly proportional to the decibel level of the signal applied to the gain control circuit. For the purposes of definition in this specification, a Delayed AGC circuit is one where the application of AGC does not start until the input (or output) signal level rises to a certain (predetermined) level.

It is, therefore, an object of the present invention to provide an improved received signal level monitor.

Other objects and advantages of the present invention will be apparent from a reading of the specification and appended claims in conjunction with the drawings, where:

DETAILED DESCRIPTION

Figure 1:
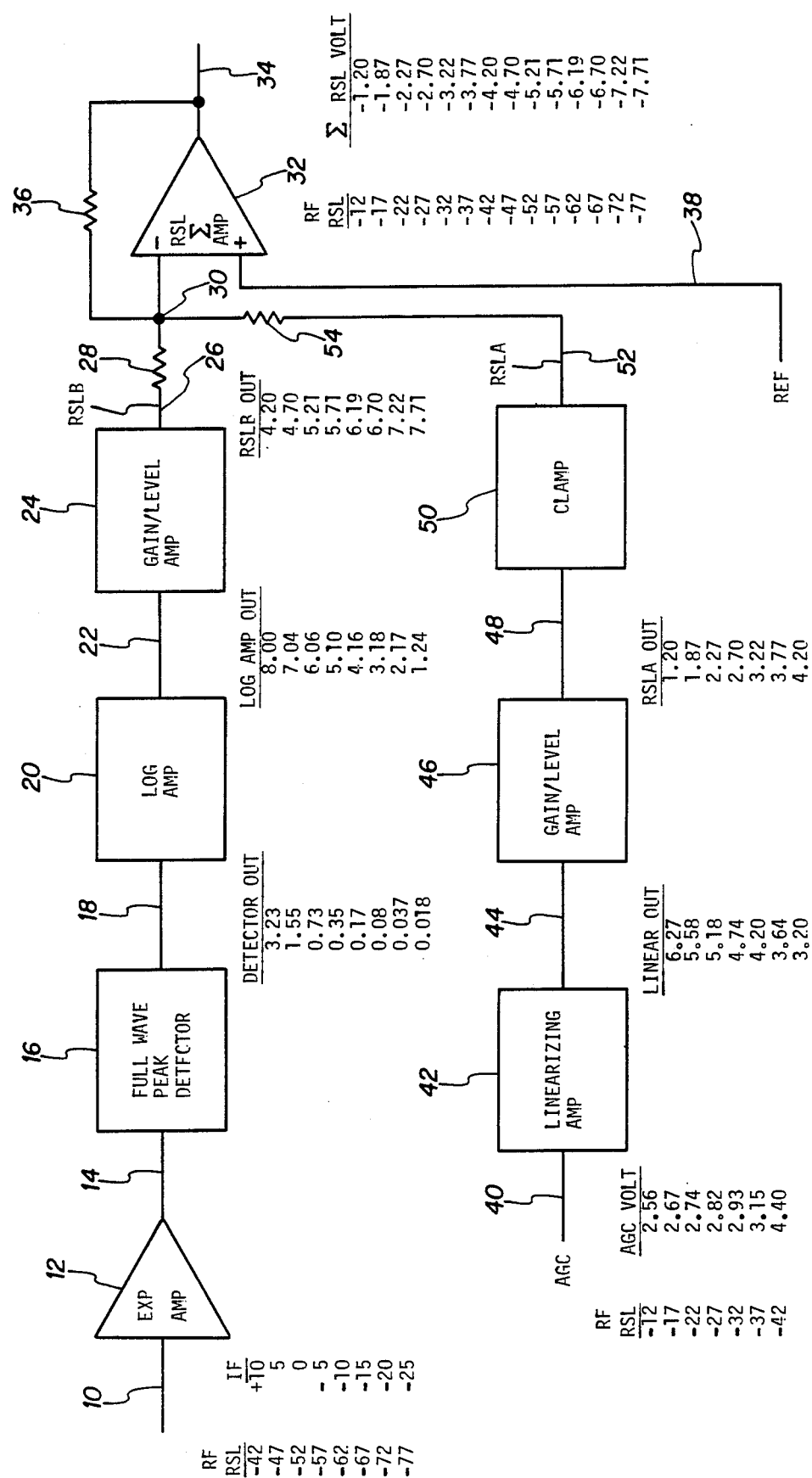
FIG. 1 is a block diagram of the basic inventive concept.

In FIG. 1, an IF signal is supplied on a lead 10 to an exponential amplifier 12 whose output is supplied on a lead 14 to a full wave peak detector 16. The output of full wave peak detector 16 is supplied on a lead 18 to a log or logrithmetic amplifier 20 whose output is supplied on a lead 22 to a gain/level amplifier 24. In one embodiment, the amplifier 20 was a LOG 100 device sold by Burr-Brown. An output of block 24 is supplied on a lead 26 to a resistor 28 which is connected to a summing point 30. Summing point 30 is connected to an inverting input of an RSL summing amplifier 32 having an output 34. A feedback resistor 36 is connected between output 34 and summing point 30. A reference voltage is supplied on a lead 38 to a non-inverting input of amplifier 32 to set output 34 for a given RF RSL input. An AGC voltage signal is supplied on a lead 40 to a linearizing amplifier 42 having an output lead 44 connected to a gain level amplifier 46. An output of amplifier 46 is connected via a lead 48 to a clamp circuit 50 which has an output on a lead 52. A summing resistor 54 is connected between lead 52 and summing point 30. Also found in FIG. 1 are labeled tables near various leads. These tables provide typical voltages for signal levels corresponding to similar signal levels on others of the tables. In other words, a 1.24 volt output signal is provided on lead 22 when an input received signal level of −77 dBM is applied to lead 10 of exponential amplifier 12. As illustrated, a −77 dBM input signal corresponds to a −25 dBM IF signal actually appearing on lead 10. Likewise, a signal of 3.77 volts is obtained on lead 48 from the gain level amplifier 46 when a received signal level is equivalent to −37 dBM which corresponds to an AGC voltage on lead 40 of 3.15 volts being returned to driver 103 of FIG. 2. The set of signals labeled RSL immediately below amplifier 32 lists the composite received signal level appearing at lead 85 of FIG. 2 with the summation output voltages appearing for each corresponding input received signal at output lead 34. Thus, with a received signal level of −52 dBM, the output voltage on lead 34 is −5.21 volts.

Figure 2:
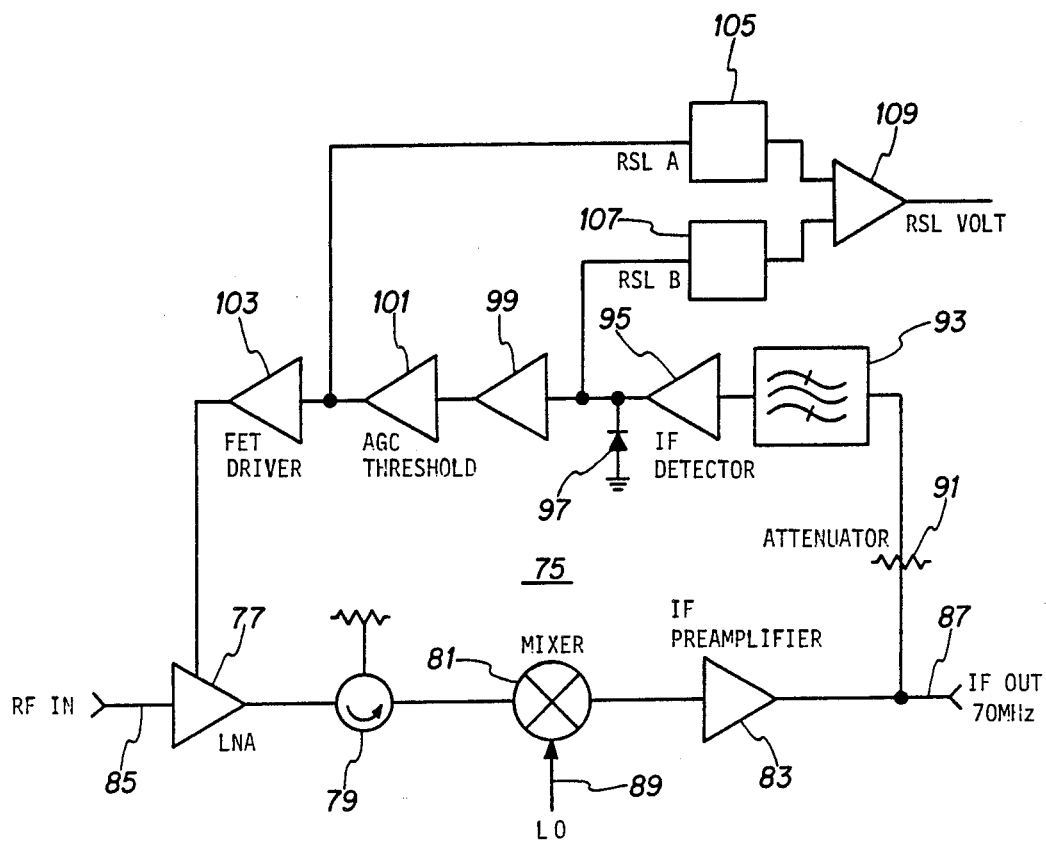
FIG. 2 is a block diagram of the inventive concept as applied to a down converter with AGC control.

In FIG. 2, a delayed AGC circuit is illustrated and generally designated as 75. In other words, the LNA gain is relatively constant for low input signal levels and decreases for high signal levels to maintain a constant IF output signal above the AGC threshold. The main portion of the circuit comprises a low noise amplifier (LNA) 77, a circulator 79, a mixer 81 and an IF preamplifier 83. A RF input is supplied on a lead 85 to the LNA 77 and an IF output is supplied from IF preamplifier 83 on a lead 87. A local oscillator supplies a further input on a lead 89 to the mixer 81. A feedback path is provided from output 87 to the low noise amplifier 77 via an attenuator 91, a band pass filter 93, an amplifier 95, a diode IF detector 97, a further isolating amplifier 99, an AGC threshold amplifier 101 and FET driver amplifier 103. The present invention is generally illustrated as comprising four additional blocks 95, 105, 107 and 109. Block 95 comprises the components in the linear IF detector corresponding to blocks 12 and 16 shown in FIG. 1. Block 105 comprises the components shown in FIG. 1 as blocks 42, 46 and 50, while block 107 comprises the components shown in FIG. 1 as 20 and 24. The amplifier 109 comprises the device 32 of FIG. 1 and its associated summing resistors.

Figure 3:
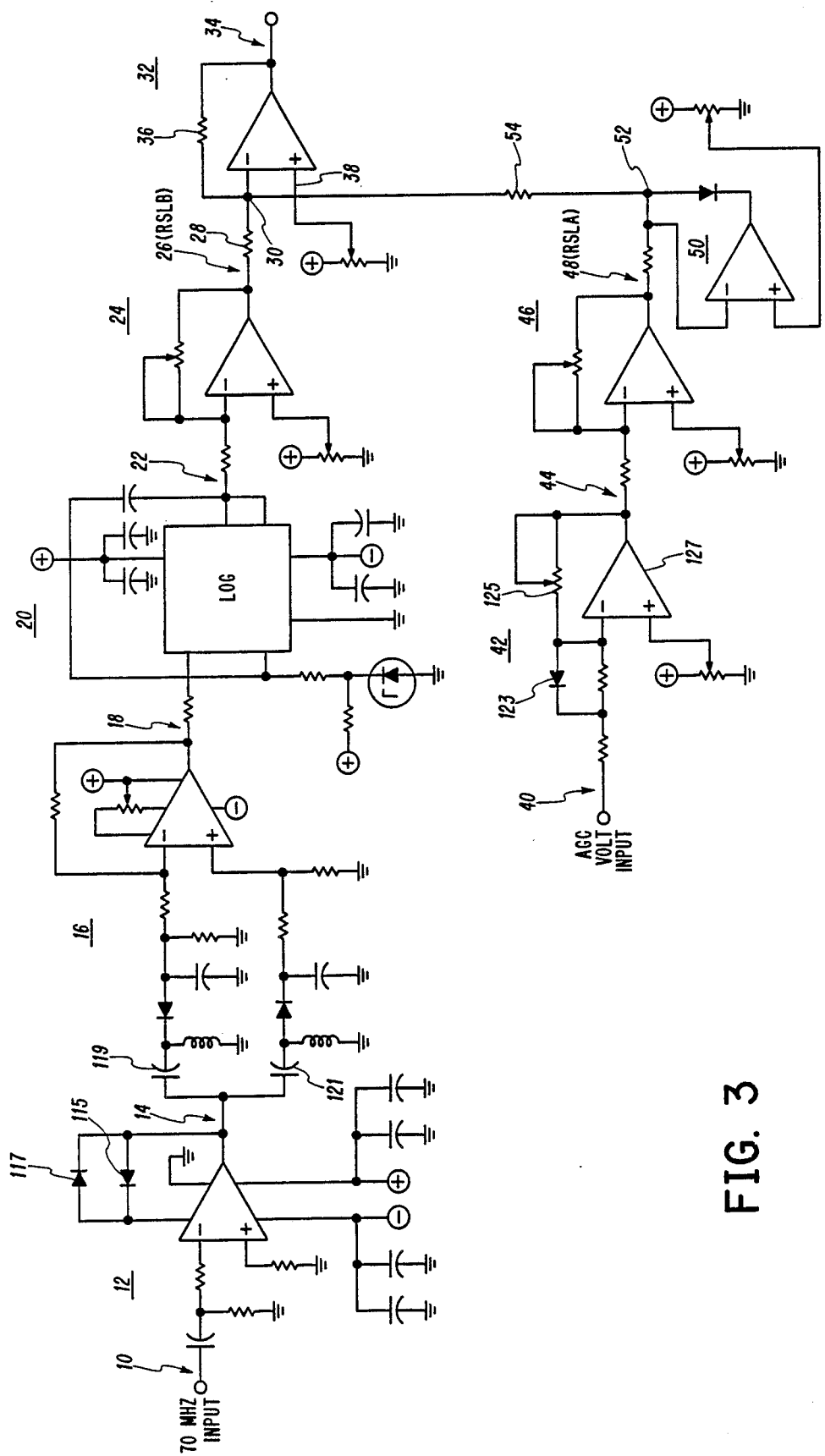
FIG. 3 is a schematic diagram illustrating in more detail the contents of the blocks of FIG. 1 for a preferred embodiment of the inventive concept.

In FIG. 3, the same numbers are used as were previously used in FIG. 1, where appropriate. In addition, diodes 115 and 117 are shown connected in a back-to-back configuration in the feedback path of the exponential amplifier to obtain the exponential gain operation. Capacitors 119 and 121 are used to block DC voltages at the output of exponential amplifier 12. The detector circuit 16, by operating in a full wave mode, boosts the total DC output to remain above the amplifier input bias current effects and to improve the square law diode behavior for the low signal region. The log amp 20 is used to obtain a linear DC output proportional to the IF input supplied at input 10. As will be known, if a number n is taken to a power p then taking the log of this number will provide a straight line function on linear graph paper. Thus, the output from log amplifier 20 changes an equal amount for an equal dBM IF power input change at input 10. (The amplifier 12 provides a gain increase as the signal lead decreases to provide an exponential output). Since the voltage range at lead 22 is not conveniently usable, a gain/level amplifier 24 is used to change the gain to an appropriate amount for the present circuit. As will be noted from the graph corresponding to lead 26, the voltage found at lead 26 is the same by a factor of 10 as the receive signal level (RSL) in decibels as found at lead 10.

The RSLA voltages derived from the AGC threshold amplifier of block 101 in FIG. 2 are supplied at input 40 of the linearizing amplifier 42. A PIN diode 123 is the key in this circuit to obtaining a linear output. The PIN diode 123 primarily changes resistance as the current through the diode changes. In one embodiment of the invention, this resistance changes from about 10,000 ohms with no current to 10 ohms with 20 milliamps. The resistance changes rapidly for small values of current as an exponential or logarithmic function. The effect produced is to change the gain of the amplifier within linearizing amplifier 42 by the ratio of the feedback resistance to the input resistance. The feedback resistance is designated as 125 between the output of an operational amplifier 127 in linearizing amp 42 and a negative or inverting input of amplifier 127. The positive voltage present on the non-inverting input of amplifier 127 determines the conduction range for diode 123 as the RF signal level increases. For a 3.5 volt setting, the PIN diode turns on above about −40 dBM RSL. When the pin diode is reverse biased, the resistance of this PIN diode is high. However, as the RF input power increases, the PIN diode cathode becomes negative compared to the anode which starts conduction and causes a decrease in the PIN diode resistance and an increase in gain of amplifier 127 to match the decline in the rate of change of the AGC voltage. The gain level amplifier 46 then adjusts the output voltage as illustrated at point 48 to match in a 10:1 ratio the dB value of the input voltage as applied to lead 40 in a manner similar to that of gain amplifier 24 in the RSLB circuit. Finally, a clamp circuit 50 is used to prevent the voltage at junction point 52 from ever becoming greater than 4.2 volts.

Figure 4:
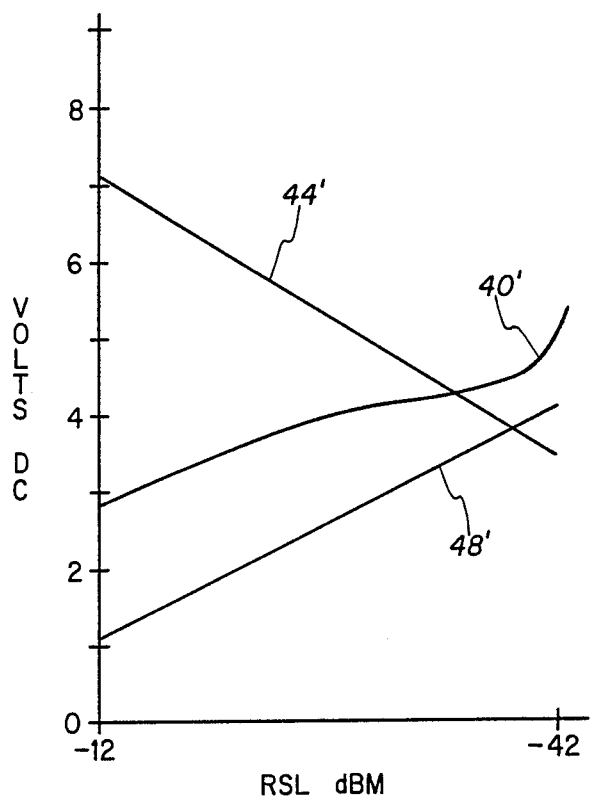
FIG. 4 is a graph illustrating the relative signal levels received and generated in the lower portion of FIG. 1.
Figure 5:
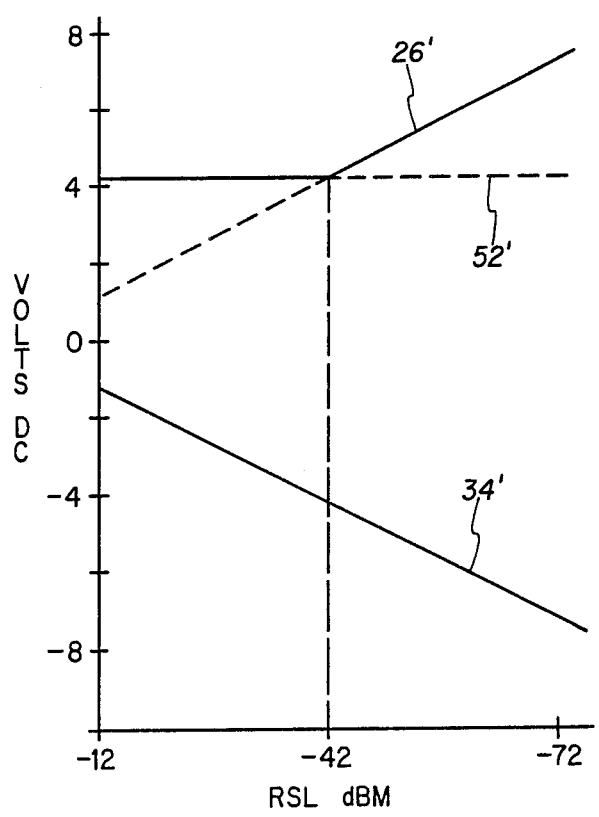
FIG. 5 is a graph representing signal levels appearing in connection with the summing amplifier 32 of FIG. 1.

FIG. 4 provides a visual or graphic indication of the information in the charts with a prime number to indicate the corresponding lead in FIG. 1 that the chart represents. FIG. 4 shows a curve 40' which is the AGC voltage into linearizing amplifier 42 over a range of −12 dB to −42 dB and the output is represented by curve 44'. As will be observed, it linearizes the AGC input to be a straight line output. The curve 48' merely indicates a signal inversion and a gain change as accomplished by amplifier 46. FIG. 5 illustrates the two signals RSLA and RSLB found on leads 26 and 52 as applied to summing amplifier 32 and its resultant output appearing on lead 34 over the range of −12 to −72 dB. As will be observed, the signal appearing on lead 26 is at a constant value until the −42 dB input signal level is reached and then it starts rising whereas the signal on lead 52 rises from −12 dB to −42 and then stays at the constant 4.2 volt level from then on. Thus, the reference input signal on lead 38 is able to counteract the effect of the summed voltage that happens at that instant to be a constant 4.2 volt so that the output appearing on lead 34 represents whichever input signal happens to be changing in value at that time.

OPERATION

As previously indicated, the object of the present invention is to measure the level of a received signal, where this received signal varies in an exponential (dB) fashion, and where it is desired that the output indication be a linear change, suitable for a metered output. Since the level of the received signal varies over an extremely wide range, it would be expensive to repeat the low noise amplifier circuitry involved in the lower portion of FIG. 2. Further, since the signal processing circuitry of FIG. 2 uses a delayed AGC feedback type operation, the output, such as at 87, cannot be directly sensed over the entire operational range. Thus, the circuitry of FIG. 1 detects the output directly in the received signal level B portion of the circuit before AGC action is commenced, and limits the output of block 107 when that action is commenced. As was further stated previously, block 105 provides a constant output prior to the time that the lower portion of FIG. 2 is in the AGC mode. Once it commences in the automatic gain control mode, the output of block 105 changes. While the output of block 105 is changing, the block 107 provides a constant output having the same value as was previously provided as a constant output by block 105. Thus, as can be ascertained from FIG. 1, there is a reference input which is used as applied to a non-inverting input to cancel out the constant value provided by either of block 105 or 107 when they are in an inactive mode. Thus, the summing amplifier 109 acts to provide an output which merely has to range from −1.2 volts to −7.7 volts, while representing a change in received level input signal from −12 dBM to −77 dBM. The recorded signal levels adjacent the various points in the block diagram of FIG. 1 are applicable to one FM embodiment of the invention, and the relative values may be typical of other FM embodiments as well as digital embodiments.

In summary then, the invention, in a preferred embodiment, detects the level of a received signal which is operated upon by a circuit, such as shown in FIG. 2, which provides AGC control after the signal exceeds a set amount, such as −42 dBM, by amplifying a signal representative of the output for values less than −42 dBM and for sampling the AGC signal for values greater than the set amount of −42 dBM. Referring specifically to FIG. 1, the amplifier 12 essentially alters the gain exponentially and the full wave peak detector 16 changes the RMS value to a dc value while the log amp block 20 provides a linear output for the lower RSL range. The gain/level amplifier 24 provides a constant output for values greater than the set amount and a linearly changing value from the set amount to the minimum detectable signal. This is shown as curve 26' in FIG. 5. The linearizing amplifier 42 takes the non-linear AGC signal shown as 40' in FIG. 4, and converts it to a linear signal, such as shown as 44' in FIG. 4. The gain/level block 46 inverts this and changes the gain as shown by curve 48' in FIG. 4. The clamp 50 prevents the output from exceeding the set value of 4.2 volts. Thus, the horizontal dash line curve shown as 52' in FIG. 5 is the result of the output of clamp 50. The amplifier 32, in conjunction with the reference input on 38, sums the two incoming signals shown as 26' and 52' and produces the output shown as 34' in FIG. 5, since the effect of the two constant voltages appearing in the two different ranges is removed by the reference input on lead 38.

As previously indicated, the amplifier shown in the block diagram of FIG. 1 represents an fm embodiment. A digital embodiment is extremely similar except that a further clamp is placed between block 42 and block 46 in one embodiment of the invention so that the signal RSLA does not further increase when the signal being detected rises higher than −12 dBM.

While one embodiment of the invention has been shown in detail, and another embodiment of the invention has been discussed, we wish to be limited not by the drawings and discussion, but only by the scope of the appended claims, wherein we claim:

1. Apparatus for detecting received signal levels operating in conjunction with a part-time automatic gain control amplifier comprising, in combination:
   summing amplifier means, including input and output means, said output means providing an indication of received signal level amplitude;
   reference level means for providing a compensating reference signal to said summing amplifier means;
   first detection means, connected to said summing amplifier means, for detecting linearly changing output signals from a monitored amplifier prior to initiation of automatic gain control feedback signals, the first detection means always supplying signals of at least the amplitude of said reference signal to said summing amplifier and supplying linearly changing signals having an amplitude greater than said reference signal as the amplitude of the signal being detected drops; and
   second detection means, connected to said summing amplifier means, for detecting non-linear feedback signals generated in the automatic gain control amplifier and for supplying linearly changing signals to said summing amplifier means representative of those detected having an amplitude up to a maximum of the reference level signal.

2. Wide range signal detection apparatus having dual inputs comprising, in combination:
   summing amplifier means, including input and output means, said output means providing a linearly changing indication of non-linearly changing detected signal level amplitudes detected by said apparatus;
   reference level means for providing a compensating signal to said summing amplifier means;
   first signal detection means, connected to said input means of said summing amplifier means, for providing thereto a signal which linearly increases to a maximum, corresponding to said compensating signal, with decreasing detected values of a first non-linear characteristic detected signal; and
   second signal detection means, connected to said input means of said summing amplifier means, for providing thereto a signal which linearly decreases to a minimum, corresponding to said compensating signal, with increasing detected values of a second detected signal having a non-linear characteristic different from said first detected signal.

3. Apparatus as claimed in claim 2 wherein said first signal detection means comprises signal detecting linearizing amplifier means and maximum output signal level means connected in series.

4. Apparatus as claimed in claim 2 wherein said second signal detection means comprises signal detecting exponential amplifier means, full wave peak detector means, logarithmic amplifier means and minimum output signal level amplifier means connected in series.

5. Apparatus as claimed in claim 2 wherein:
   said first signal detection means comprises signal detecting linearizing amplifier means and maximum output signal level means connected in series; and
   said second signal detection means comprises signal detecting exponential amplifier means, full wave peak detector means, logarithmic amplifier means and minimum output signal level amplifier means connected in series.

6. Apparatus for combining first and second signals representing two different slope characteristics of a single event comprising, in combination:
   first means for supplying a first signal to be linearized and combined;
   second means for supplying a second signal to be linearized and combined;
   third means, connected to said first means, for modifying the first signal to provide a linearly changing output third signal at least up to a given signal amplitude level;
   fourth means, comprising a part of said third means, for preventing said third signal from exceeding a value representative of said given signal amplitude level;
   fifth means, connected to said second means, for modifying the second signal to provide a linearly changing output fourth signal at least from said given signal amplitude level to higher values the fourth signal having a common intersection point with said third signal at said given signal amplitude level;
   sixth means, comprising a part of said fifth means, for preventing said fourth signal from falling below a value representing said common intersection point; and
   seventh means, connected to said fourth and sixth means, for summing said third and fourth signals with a complimentary reference to generate a linearly changing fifth signal.

* * * * *